United States Patent
Tu et al.

(10) Patent No.: US 8,643,022 B2
(45) Date of Patent: Feb. 4, 2014

(54) LIGHT EMITTING DIODES AND METHOD FOR MANUFACTURING THE SAME

(75) Inventors: Po-Min Tu, Hsinchu (TW); Shih-Cheng Huang, Hsinchu (TW); Ya-Wen Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/300,731

(22) Filed: Nov. 21, 2011

(65) Prior Publication Data

US 2012/0175630 A1     Jul. 12, 2012

(30) Foreign Application Priority Data

Jan. 10, 2011   (CN) .......................... 2011 1 0005426

(51) Int. Cl.
*H01L 33/02* (2010.01)

(52) U.S. Cl.
USPC ................. 257/76; 257/98; 257/99; 257/103; 257/E33.023; 257/E33.064

(58) Field of Classification Search
None
See application file for complete search history.

(56) References Cited

U.S. PATENT DOCUMENTS

| | | | |
|---|---|---|---|
| 6,657,237 B2 | 12/2003 | KwaK et al. | |
| 2002/0017653 A1 | 2/2002 | Chuang | |
| 2005/0230692 A1* | 10/2005 | Kim et al. | 257/79 |
| 2006/0197102 A1* | 9/2006 | Ogihara et al. | 257/99 |
| 2007/0272939 A1* | 11/2007 | Peng | 257/99 |
| 2008/0121907 A1* | 5/2008 | Wen et al. | 257/94 |
| 2010/0276722 A1 | 11/2010 | Baur et al. | |
| 2011/0068359 A1* | 3/2011 | Yahata et al. | 257/98 |
| 2011/0133229 A1* | 6/2011 | Tsai et al. | 257/93 |
| 2012/0175628 A1* | 7/2012 | Huang et al. | 257/76 |

FOREIGN PATENT DOCUMENTS

| | | |
|---|---|---|
| CN | 1367540 A | 9/2002 |
| TW | 200919789 A | 5/2009 |

* cited by examiner

*Primary Examiner* — Minh-Loan T Tran
*Assistant Examiner* — Fazli Erdem
(74) *Attorney, Agent, or Firm* — Altis Law Group, Inc.

(57) ABSTRACT

An LED comprises an electrode layer comprising a first a second sections electrically insulated from each other; an electrically conductive layer on the second section, an electrically conductive pole protruding from the electrically conductive layer; an LED die comprising an electrically insulating substrate on the electrically conductive layer, and a P-N junction on the electrically insulating substrate, the P-N junction comprising a first electrode and a second electrode, the electrically conductive pole extending through the electrically insulating substrate to electrically connect the first electrode to the second section; a transparent electrically conducting layer on the LED die, the transparent electrically conducting layer electrically connecting the second electrode to the first section; and an electrically insulating layer between the LED die, the electrically conductive layer, and the transparent electrically conducting layer, wherein the electrically insulating layer insulates the transparent electrically conducting layer from the electrically conductive layer and the second section.

12 Claims, 8 Drawing Sheets

LIGHT EMITTING DIODES AND METHOD FOR MANUFACTURING THE SAME

BACKGROUND

1. Technical Field

The present disclosure relates to solid state light emitting devices and, more particularly, to light emitting diodes (LEDs).

2. Description of Related Art

In recent years, LEDs have been widely used in devices to provide illumination. Typically, an LED may include an LED die, an electrode layer, and two gold wires. The LED die may include a light emitting surface. Two spaced terminals may be formed on the light emitting surface. The LED die may be electrically connected to the electrode layer through wire bonding, in which the two gold wires may be respectively soldered to the terminals and the electrode layer by solder. However, part of the light emitting surface of the LED die may be blocked by the solder and the gold wires, resulting in a decreased illumination efficiency of the LED.

What is needed, therefore, is an LED to overcome the described disadvantages.

DETAILED DESCRIPTION

Figure 1:
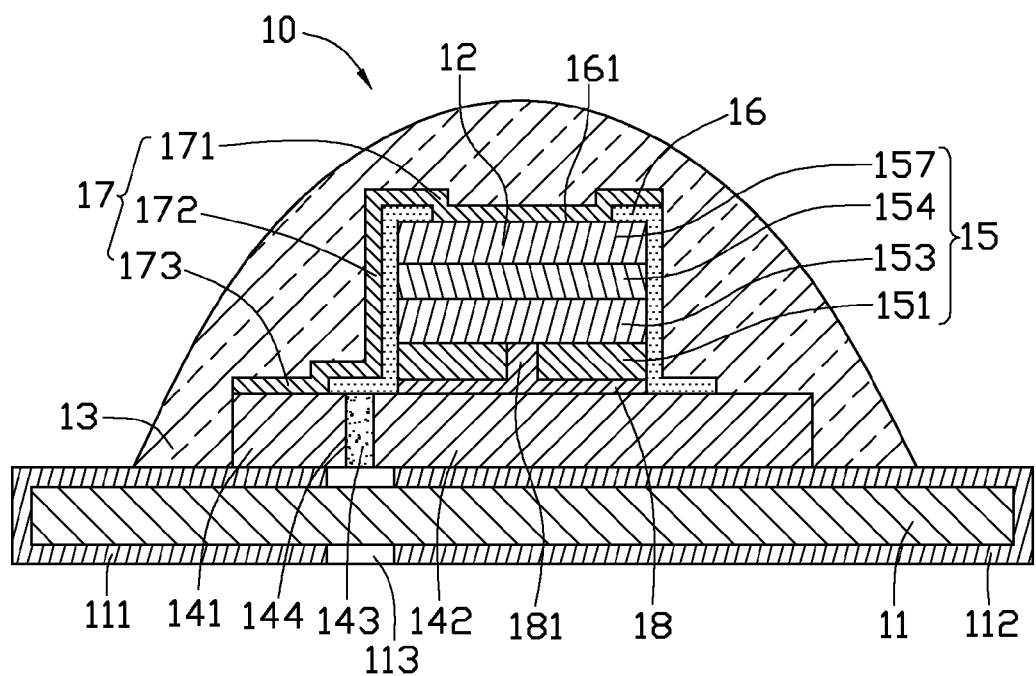
FIG. 1 is a cross-sectional view of an LED of a first embodiment of the present disclosure.

Referring to FIG. 1, an LED 10 is shown. The LED 10 may include a base 11, an LED chip 12 arranged on the base 11, and a packaging layer 13 arranged on the base 11 and encapsulating the LED chip 12 therein.

The base 11 is electrically insulated and has a size larger than the LED chip 12. An outer surface of the base 11 is coated with a layer of electrically conductive material. A continuous gap 113 is defined in the electrically conductive material to divide the electrically conductive material into two separate parts: a first electrode part 111 and a second electrode part 112. The base 11 has good heat dissipation efficiency and absorbs heat generated from the LED chip 12 to prevent the LED chip 12 from overheating.

Figure 7:
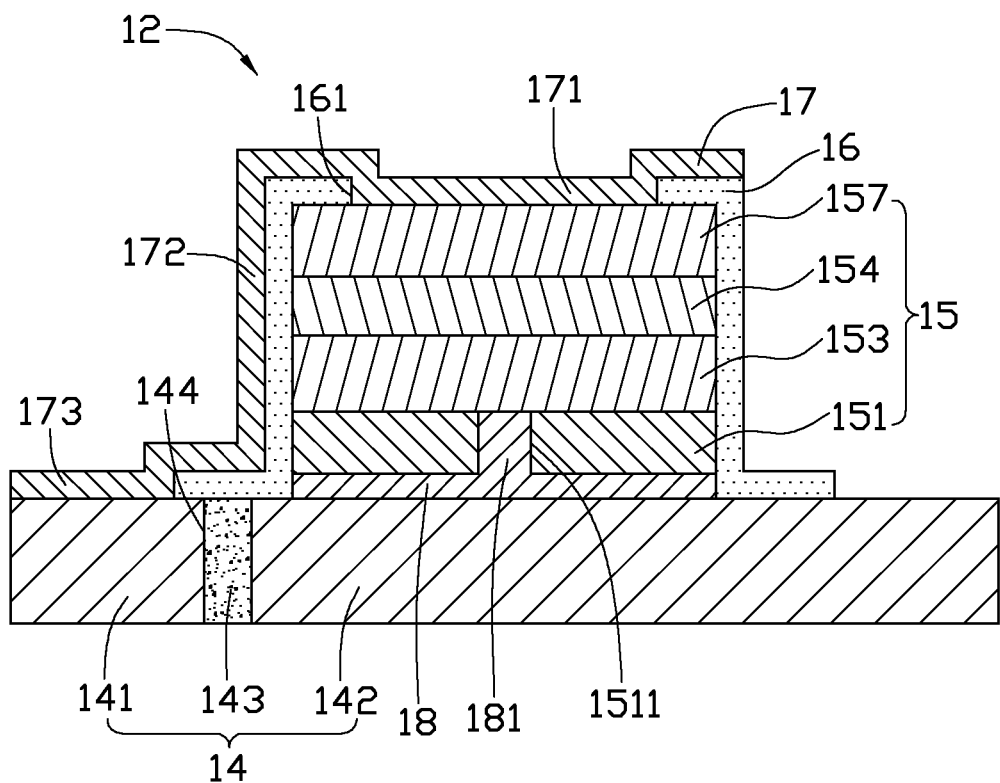

Referring also to FIG. 7, the LED chip 12 may comprises an electrode layer 14, an electrically conductive layer 18 formed on the electrode layer 14, an LED die 15 formed on the electrically conductive layer 18, an electrically insulating layer 16 surrounding the LED die 15 and the electrically conductive layer 18, and a transparent electrically conducting layer 17 electrically connecting the LED die 15 and the electrode layer 14.

The electrode layer 14 has a size smaller than that of the base 11 and is formed on a central portion of a top of the base 11. A through hole 144 is defined in the electrode layer 14 and aligned with the continuous gap 113 of the base 11. In the present embodiment, the through hole 144 is located at a left side of the LED die 15, and has a width smaller than a width of the continuous gap 113 of the base 11. The through hole 144 is coaxial with the continuous gap 113. An electrically insulating material 143 is filled in the through hole 144. The through hole 144 divides the electronic layer 14 into two separate sections: a first section 141 and a second section 142. The insulating material 143 is between the first section 141 and the second section 142 to insulate the first section 141 from the second section 142. The first section 141 and the second section 142 are electrically connected to the first electrode part 111 and the second electrode part 112, respectively.

The LED die 15 includes an electrically insulating substrate 151, an N-doped region formed on the electrically insulating substrate 151, an active layer 154 formed on the N-doped region, and a P-doped region formed on the active layer 154. In this embodiment, the P-doped region is a P-type gallium nitrogen layer 157. The N-doped region is an N-type gallium nitrogen layer 153. The electrically insulating substrate 151, the N-type gallium nitrogen layer 153, the active layer 154 and the P-type gallium nitrogen layer 157 are stacked one on the other along a vertical direction of the LED 10. The N-type gallium nitrogen layer 153, the active layer 154, and the P-type gallium nitrogen layer 157 cooperatively construct a P-N junction.

The electrically conductive layer 18 has a size equal to that of the LED die 15 and is located on the second section 142 of the electrode layer 14, and is electrically connected to the second section 142. A through hole 1511 is defined in the electrically insulating substrate 151. An electrically conductive pole 181 protrudes from the electrically conductive layer 18. The electrically conductive layer 18 is coated on the electrically insulating substrate 151, and the electrically conductive pole 181 extends through the through hole 1511. The electrically conductive layer 18 is electrically connected to the N-type gallium nitrogen layer 153 through the electrically conductive pole 181.

The electrically insulating layer 16 is transparent and made of silicon dioxide or silicon nitride. In the present embodiment, the electrically insulating layer 16 completely covers lateral sides of the LED die 15 and the electrically conductive layer 18, and partially covers a periphery of a top side of the LED die 15 with a through hole 161 defined above a central portion of a top of the P-type gallium nitrogen layer 157. The electrically insulating layer 16 also covers part of top surfaces of the first and second sections 141, 142 near the LED die 15. The electrically insulating layer 16 covers the through hole 144 of the electrode layer 14.

The transparent electrically conducting layer 17 electrically connects the P-type gallium nitrogen layer 157 and the first section 141 of the electrode layer 14.

The transparent electrically conducting layer 17 is made of transparent alloys, such as indium tin oxide, or carbon nanotube film. The transparent electrically conducting layer 17 comprises a first covering portion 171 on the top side of the LED die 15, a second covering portion 173 on the first section 141, and a connecting portion 172 interconnecting the first covering portion 171 and the second covering portion 173 and on a lateral side of a left part of the electrically insulating layer 16.

The first covering portion 171 fills the through hole 161 to connect the central portion of the P-type gallium nitrogen layer 157 of the LED die 15. The second covering portion 173 is arranged on the first section 141. The electrically insulating layer 16 is located between the electrically conducting layer 17 and the LED die 15 to electrically insulate the electrically conducting layer 17 from the LED die 15 except the central portion of the top of the P-type gallium nitrogen layer 157.

The packaging layer 13 is made of transparent, electrically insulating materials, such as silicone, epoxy, quartz, or glass. The packaging layer 13 encapsulates the LED chip 12 therein and is formed on the base 11.

In the present disclosure, because the transparent electrically conducting layer 17 and the electrically insulating layer 16 are transparent, and coated directly on the LED die 15, light emitted from the active layer 154 may not be blocked by any element of the LED 10. Therefore, light emitting efficiency of the LED 10 may be improved in comparison with the conventional LED.

FIGS. 2-7 illustrate steps of manufacturing a LED chip according to an embodiment of the present disclosure.

Figure 2:
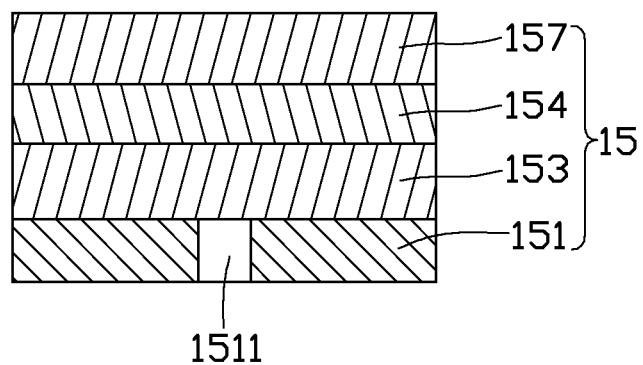
FIGS. 2-7 are cross-sectional views illustrating steps of manufacturing an LED chip of the LED as disclosed in FIG. 1.
Figure 3:
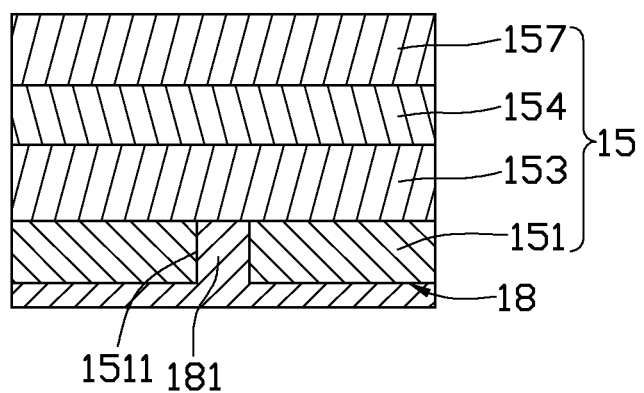

Referring to FIGS. 2-3 wherein the LED die 15 is provided. The through hole 1511 is etched through the electrically insulating substrate 151 to define the through hole 1511. An electrically conductive material is provided. The electrically conductive material fills the through hole 1511 and coats an outer surface of the electrically insulating substrate 151 to form the electrically conductive layer 18 and the electrically conductive pole 181 shown in FIG. 3.

Figure 4:
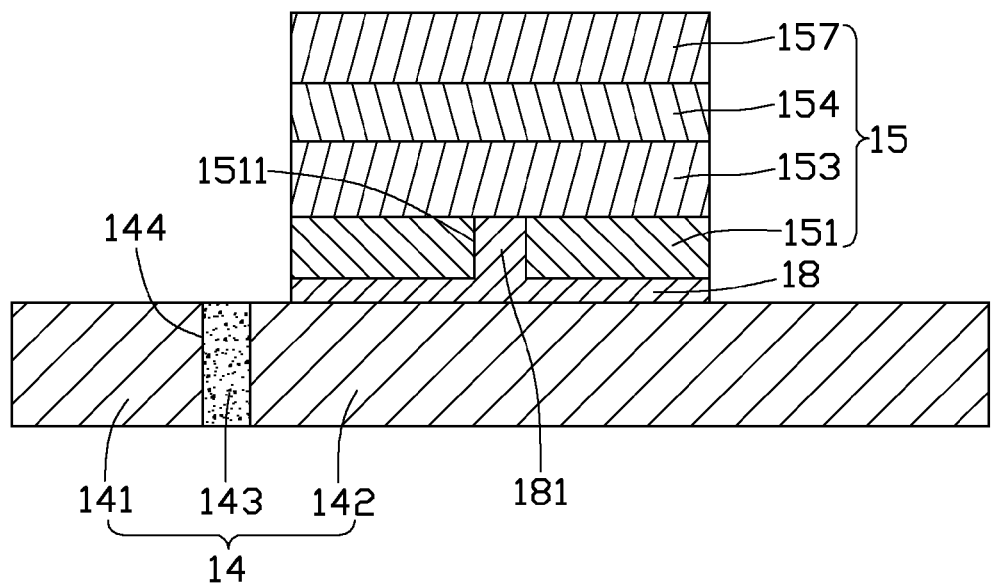

Referring to FIG. 4 wherein the electrode layer 14 is provided. The through hole 144 is etched through the electrode layer 14. The electrically insulating material 143 is filled in the through hole 144. The electrically conductive layer 18 is arranged on the second section 142 of the electrode layer 14 and is electrically connected to the second section 142.

Figure 5:
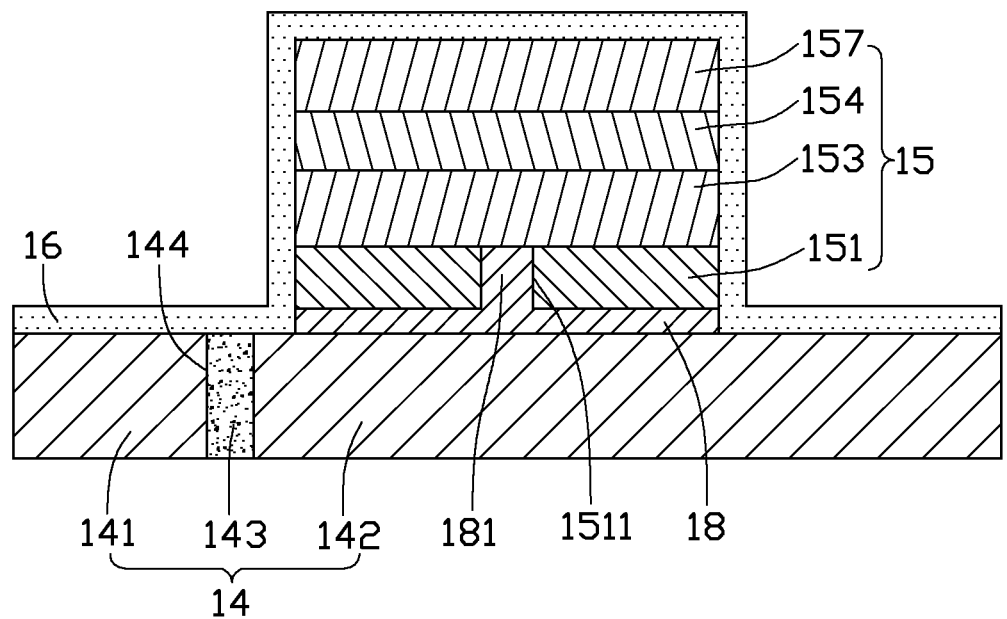
Figure 6:
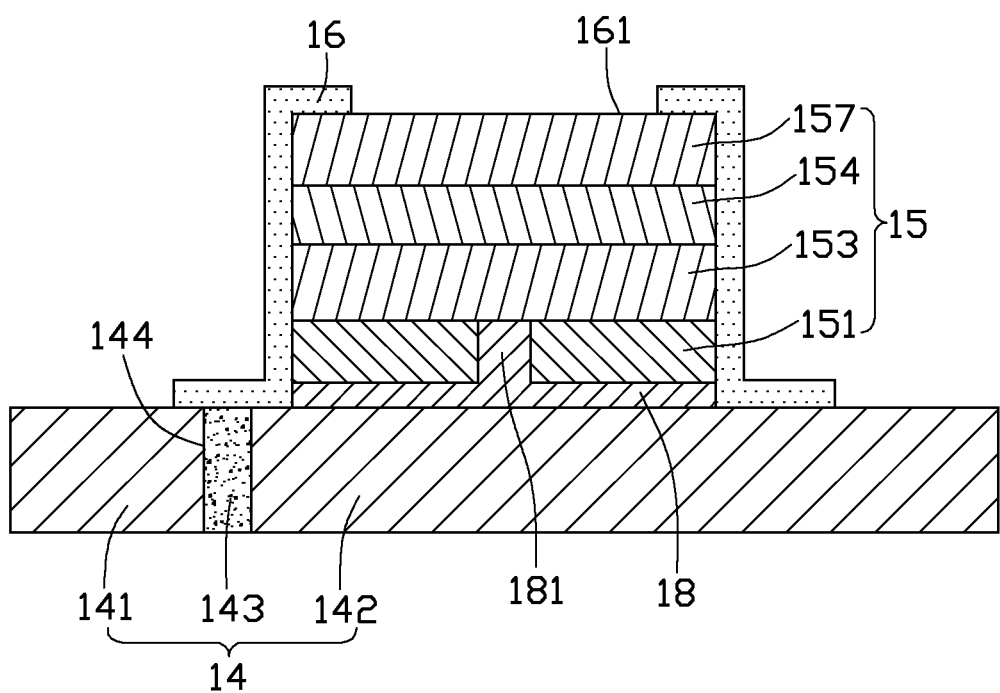

Referring to FIGS. 5-6, firstly the electrically insulating layer 16 is coated on the peripheries of the LED die 15 and the electrically conductive layer 18, and on the top side of the electrode layer 14. The electrically insulating layer 16 may be deposited through electroplating or sputtering deposition. Secondly, the electrically insulating layer 16 is etched to expose the central portion of the top of the P-type gallium nitrogen layer 157, and parts of the first section 141 and the second section 142 of the electrode layer 14. In another embodiment, the electrically insulating layer 16 may be etched only to expose the central portion of the P-type gallium nitrogen layer 157 and a part of the first section 141, while the electrically insulating layer 16 covering the second section 142 of the electrode layer 14 may remain intact.

Referring to FIG. 7, the transparent electrically conducting layer 17 is coated on corresponding parts of the LED die 15, the electrically insulating layer 16, and the electrode layer 14. The transparent electrically conducting layer 17 may be deposited through electroplating, sputtering deposition, or electron-beam evaporative deposition. The manufacturing processes of the LED chip 12 are completed.

Referring to FIG. 1 again, wherein the base 11 is provided. The base 11 is coated by an electrically conducting material and the electrically conducting material is etched to define the continuous gap 113 at a left side of the base 11. The electrode layer 14 is arranged on the base 11 with the first section 141 and the second section 142 electrically contacting the first electrode part 111 and the second electrode part 112, respectively. The through hole 144 is aligned with the central portion of the continuous gap 113. Finally, the packaging layer 13 is formed on the base 11 and encapsulates the LED chip 12 therein. The manufacturing processes of the LED 10 are completed.

Figure 8:
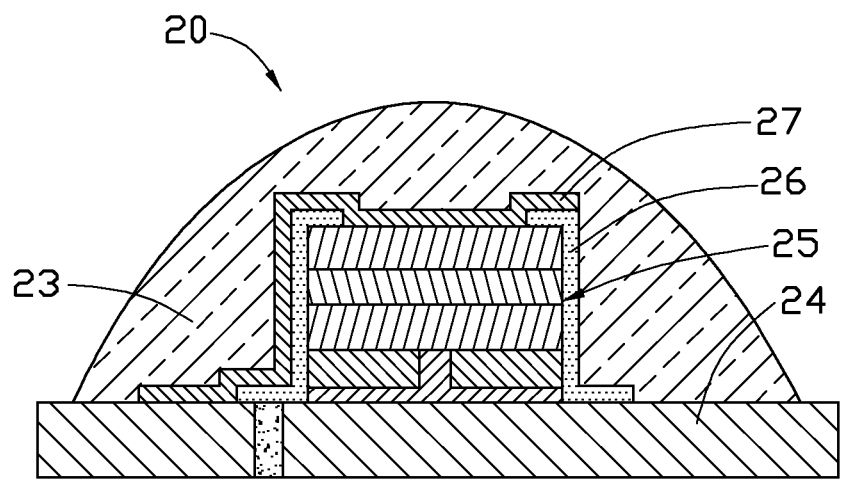
FIG. 8 is a cross-sectional view of an LED of a second embodiment of the present disclosure.

Referring to FIG. 8, wherein an LED 20 of a second embodiment is shown. The LED 20 comprises an electrode layer 24, an LED die 25, an electrically insulating layer 26, a transparent electrically conductive layer 27 and a packaging layer 23. The LED 20 has a similar LED chip as the LED chip 12 of the LED 10 of the first embodiment. However, the base 11, the first and second electrode parts 111, 112 of the LED 10 are omitted from the LED 20. A width of the electrode layer 24 in LED 20 may be larger than that of the electrode layer 14 in LED 10. The packaging layer 23 covers a central portion of a top of the electrode layer 24, with a peripheral portion thereof being exposed. The electrode layer 24 is divided into a first section and a section, wherein the first and second sections are separate by a continuous gap filled with an electrically insulating material. The first section of the electrode layer 24 functions directly as a first electrode part, and the second section of the electrode layer 24 functions directly as a second electrode part. Similar to the LED 10 of the first embodiment, the LED die 25, the electrically insulating layer 26, and the transparent electrically conductive layer 27 of the LED 20 are also encapsulated by the packaging layer 23 of the LED 20.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED comprising:
    an electrode layer comprising a first section and a second section electrically insulated from the first section, and a through hole defined in the electrode layer to space the first section and the second section;
    an electrically conductive layer formed on and electrically connected to the second section of the electrode layer, an electrically conductive pole protruding out from the electrically conductive layer;
    an LED die comprising an electrically insulating substrate arranged on the electrically conductive layer, and a P-N junction formed on the electrically insulating substrate, the P-N junction comprising a first electrode and a second electrode, the electrically conductive pole extending through the electrically insulating substrate to electrically connect the first electrode of the P-N junction to the second section of the electrode layer;
    a transparent electrically conducting layer formed on the LED die, the transparent electrically conducting layer electrically connecting the second electrode of the P-N junction to the first section of the electrode layer;
    an electrically insulating layer located between the LED die, the electrically conductive layer, and the transparent electrically conducting layer, wherein the electrically insulating layer is adapted to insulate the transparent electrically conducting layer from the electrically conductive layer and the second section of the electrode layer; and
    an electrically insulated base, and an outer surface of the base coated with a layer of electrically conductive material, a continuous gap defined in the electrically conductive material to divide the electrically conductive material into a first electrode part, and a second electrode part, the first section and the second section electrically connecting the first electrode part and the second electrode part;
    wherein the through hole communicates with the continuous gap and is coaxial with the continuous gap.

2. The LED of claim 1, wherein the electrically insulating layer comprises a through hole defined above the LED die; wherein the electrically insulating layer completely covers lateral sides of the LED die, lateral sides of the electrically conductive layer, and a periphery of the through hole of the LED die, and the transparent electrically conducting layer fills the through hole of the LED die to electrically connect with the LED die.

3. The LED of claim 2, wherein the electrically insulating layer partially covers the first section of the electrode layer, the first section comprises an exposed portion, and the exposed portion of the first section is electrically connected with the transparent electrically conducting layer.

4. The LED of claim 3, wherein the transparent electrically conducting layer comprises a first covering portion, a second covering portion, and a connecting portion interconnecting the first covering portion and the second covering portion, wherein the first covering portion fills in the through hole of the LED die and electrically connects with the LED die, and the second covering portion contacts the exposed portion of the first section of the electrode layer.

5. The LED of claim 1, wherein the through hole is filled with an electrically insulating material.

6. The LED of claim 1, wherein the electrically insulating layer is transparent.

7. The LED of claim 1, further comprising a packaging layer, the packaging layer is formed on the base; and encapsulates the LED die, the electrically conductive layer, the electrically insulating layer, the transparent electrically conducting layer, and the electrode layer therein.

8. The LED of claim 1, the LED die further comprises an N-doped region formed on the substrate, an active layer formed on the N-doped region, and a P-doped region formed on the active layer, wherein the N-doped region electrically contacts the electrically conductive pole, and the P-doped region electrically contacts the transparent electrically conducting layer.

9. The LED of claim 8, wherein the substrate, the N-doped region, the active layer, and the P-doped region are stacked one on the other.

10. The LED of claim 8, wherein the P-doped region is a P-type gallium nitrogen layer.

11. The LED of claim 8, wherein the N-doped region is an N-type gallium nitrogen layer.

12. The LED of claim 1, wherein the electrically conductive layer is transparent.

* * * * *